(12) United States Patent
Jahan et al.

(10) Patent No.: US 11,555,841 B2
(45) Date of Patent: Jan. 17, 2023

(54) DEVICE FOR RADIOELECTRIC STIMULATION BY SELF-REFERENCED RADIANT PANEL

(71) Applicant: THALES, Courbevoie (FR)

(72) Inventors: Daniel Jahan, Brest (FR); Thierry Mazeau, Merignac (FR); Stéphane Formont, Elancourt (FR)

(73) Assignee: THALES, Courbevoie (FR)

( * ) Notice: Subject to any disclaimer, the term of this patent is extended or adjusted under 35 U.S.C. 154(b) by 280 days.

(21) Appl. No.: 16/762,125

(22) PCT Filed: Sep. 7, 2018

(86) PCT No.: PCT/EP2018/074121
§ 371 (c)(1),
(2) Date: May 6, 2020

(87) PCT Pub. No.: WO2019/091625
PCT Pub. Date: May 16, 2019

(65) Prior Publication Data
US 2020/0355733 A1   Nov. 12, 2020

(30) Foreign Application Priority Data

Nov. 7, 2017   (FR) ...................................... 1701141

(51) Int. Cl.
*G01R 29/10* (2006.01)
*G01S 7/40* (2006.01)
*H01Q 3/26* (2006.01)

(52) U.S. Cl.
CPC ............ *G01R 29/10* (2013.01); *G01S 7/4052* (2013.01); *H01Q 3/2676* (2013.01); *G01S 7/4095* (2021.05)

(58) Field of Classification Search
CPC ...... G01R 29/10; G01S 7/4052; G01S 7/4095; H01Q 3/2676
See application file for complete search history.

(56) References Cited

FOREIGN PATENT DOCUMENTS

FR     2 695 759 A1    3/1994
WO   2015/028091 A1   3/2015

OTHER PUBLICATIONS

Godinez, et al., "RF Characterization of Zero-Biased Photodiodes", Journal of Lightwave Technology, vol. 26, Issue 24, pp. 3829-3834, (2008).

(Continued)

*Primary Examiner* — Dao L Phan
(74) *Attorney, Agent, or Firm* — BakerHostetler

(57) ABSTRACT

A device for the radio stimulation of an antenna includes at least one transmission sub-assembly formed by an array of radiating elements and an array of photoelectric receivers; as well as a generator that synthesizes a set of electrical signals that are intended to excite each radiating element. The electrical signals are transmitted to the transmission sub-assembly in the form of modulated light waves that are multiplexed to form a composite laser beam that illuminates the array of photoelectric receivers. Each of the photoelectric receivers receives a light wave. The array of photoelectric sensors and the array of radiating elements have substantially identical arrangements. Each photoelectric receiver is connected to a radiating element in its array at a position identical to the one that said receiver occupies within its own or a position symmetrical thereto.

8 Claims, 10 Drawing Sheets

(56) References Cited

OTHER PUBLICATIONS

Dorsey, et al., "Design and Performance of Frequency Selective Surface With Integrated Photodiodes for Photonic Calibration of Phased Array Antennas", IEEE Transactions on Antennas and Propagation, vol. 58, No. 8, pp. 2588-2593, 2010.

Paek, et al., "Photonic in-situ calibration of a phased array antenna using planar lightwave circuit", 2005 International Topical Meeting on Microwave Photonics, pp. 351-354, 2005.

Levine, et al., "Fiber optic networks for phased arrays", 17th Convention of Tel Aviv, pp. 390-393, 1991.

Shimizu, et al., "Photodiode-integrated microstrip antenna array for subterahertz radiation", IEEE Photonics Technology Letters, vol. 18, No. 6, pp. 743-745, 2006.

DEVICE FOR RADIOELECTRIC STIMULATION BY SELF-REFERENCED RADIANT PANEL

CROSS-REFERENCE TO RELATED APPLICATIONS

This application is a National Stage of International patent application PCT/EP2018/074121, filed on Sep. 7, 2018, which claims priority to foreign French patent application No. FR 1701141, filed on Nov. 7, 2017, the disclosures of which are incorporated by reference in their entirety.

FIELD OF THE INVENTION

The technical field of the invention is that of beamforming antennas produced in particular in solid state.

The field of use of the invention is that of testing and stimulating radio reception systems, in particular once installed on their carrier platform, such as for example radar detectors or communications interceptors.

BACKGROUND

In order to stimulate a radio reception system once installed on its carrier platform without making any changes thereto, one solution is to resort to conventional generation of a radio signal remote from said radio reception system. The distance then imposes a certain level of radiated power in the direction of said radio reception system, and solutions similar to those of operational transmitters, in which said radio reception systems are designed to receive signals, are of course candidates.

There is a fallback for example on radar architectures limited to transmission (reception not having any benefit here since only the transmitted signal is desired) and, in particular, on radar architectures with electronic scanning, which has the benefit of not requiring mechanical means to point the beam from the test antenna at the radio reception system to be tested.

These architectures define devices that are generally compact. However, for some applications, it is sometimes useful to be able to separate the part generating the stimulation signal with its phase law from the part that radiates said stimulation signal, while at the same time as far as possible keeping a simple structure thereof since, for the needs of some applications, it may be multiplied.

In this context, one technical problem consists in finding a hardware solution for transporting the stimulation signal with its phase law so as to transmit the desired radio signal in the desired direction.

Insofar as existing stimulation devices are very generally compact, the prior art does not offer any solution for separating the part generating the stimulation signal from the radiating part.

The known devices are in particular based on architectures such as those illustrated in FIGS. 1 and 2.

FIG. 1 shows a conventional structure for generating a phase law by way of controlled phase shifters 11 connected to transmission modules 12.

FIG. 2 shows a conventional structure for generating a phase law directly by way of waveform generators 21 that are also controlled in terms of phase (MIMO structure for multiple inputs multiple outputs), connected to transmission modules 12.

One solution in order to be able to separate the part generating the stimulation signal with its phase law from the part that radiates said simulation signal consists, as illustrated in FIG. 3, in splitting the structure of the transmission modules that radiate the stimulation signal into two, at the output of the phase-shifted signals, just at the input of the power amplification stage.

This division leads to the elements that form the set of phase-shifted signals that carry the phase law of the stimulation signal to be radiated being grouped together, in terms of hardware, into a first signal generator assembly 31, and to the elements that amplify the power of the signals and their radiation being grouped together, in terms of hardware, into a second assembly 32, remote from the first one. Such a solution, illustrated by FIG. 3, is in particular equally applicable to the structures illustrated by FIGS. 1 and 2.

However, using such a solution involves controlling the routing of the microwave signals produced by the first assembly 31, which signals may reach several tens of GHz, to the second assembly 32, the two assemblies possibly being spaced from one another by several tens of meters. This routing 33 specifically has to be performed without loss or alteration of the relative phases of the signals that are conveyed.

Since routing very high frequency signals from one apparatus to another remote apparatus by way of fiber-optic links is well known, one solution for routing the microwave signals produced by the first assembly 31 to the second assembly 32 is naturally that of using an offset 41 by way of optical fibers. Such a solution is illustrated by FIG. 4.

Such a solution may be implemented using various variants known from the prior art. It is in particular possible to use a number of optical fibers lower than the number of signals to be routed. For this purpose, a plurality of signals carried by laser waves of different wavelengths may be multiplexed on one and the same optical fiber; this wavelength multiplexing obviously involving demultiplexing on arrival.

However, the problem with such a solution is that of maintaining, in spite of everything, a physical link between the two hardware units 31 and 32, which constitutes a difficulty for some applications.

Another solution based on an optical offset between the two assemblies 31 and 32 consists, as illustrated in FIG. 5, in routing the signals produced by the assembly 31 through a composite laser beam, each component $s_{k,i}(t)$ of the radiated stimulation signal being carried by a laser wave of a different wavelength. The laser beam is directed toward a set of optoelectronic receivers arranged in a plane, a matrix-array of photodiodes for example, each laser wave being intended to be received by a dedicated optoelectronic receiver, connected to the transmission module $e_i$ intended to radiate said component.

However, in order to be able to guarantee that the desired phase law is maintained, such a means generally has to be accompanied by means for measuring and correcting the phase bias introduced by the distance and the direction of incidence $(D,\alpha,\beta)$ of the composite laser beam with respect to the plane of the optoelectronic sensors, so as to transmit a signal having the phase shift required to form the radiated signal to each of the transmission modules. Adding such means makes it more difficult to implement such a solution and reduces the advantages that it provides in terms of eliminating the physical link between the assembly that generates the signals forming the stimulation signal and the assembly that amplifies and radiates these signals.

SUMMARY OF THE INVENTION

One aim of the invention is to propose a solution for easily putting into practice the principle of optical offsetting, using a composite laser beam, of the signals forming the stimulation signals, from the sub-assembly responsible for generating these signals to the assembly responsible for amplifying and radiating these signals.

One aim of the invention consists in particular, in the context of an optical offset solution consisting of a composite laser beam directed toward a set of optoelectronic sensors arranged in a plane, a matrix-array of photodiodes for example, in finding a solution for overcoming the need to install a means for measuring and correcting the phase bias introduced, for each of the signals forming the stimulation signal, by the distance and the direction of incidence of the laser beam.

To this end, one subject of the invention is a device for the radio stimulation of an antenna comprising at least one transmission sub-assembly formed by an array of radiating elements each connected to a photoelectric receiver integrated into an array of photoelectric receivers; as well as an electrical signal generator configured so as to synthesize, for each radiating element, an electrical excitation signal having a given amplitude and phase, as a function of the position of the radiating element in the array, in accordance with a given amplitude-phase law.

According to the invention, said electrical signals are transmitted to the transmission sub-assembly in the form of a composite laser beam configured so as to illuminate the array of photoelectric receivers at a given incidence, said beam being obtained by multiplexing various light waves each modulated by an electrical excitation signal. Each of the photoelectric receivers is configured so as to receive a given light wave.

The array of photoelectric sensors and the array of radiating elements have substantially one and the same geometry with one and the same symmetry of distribution of the constituent elements in each array, each photoelectric receiver being connected to a radiating element occupying, within its array, a position identical to the one that said receiver occupies within its own or a position symmetrical thereto.

According to one embodiment of the device according to the invention, the array of photodetectors and the array of radiating elements of the transmission sub-assembly are borne by one and the same panel consisting of cells arranged in columns k and rows l, each cell comprising a photodetector and a radiating element that are substantially collocated and whose active surfaces are oriented in one and the same direction parallel to the axis (Oy). The signal generator sub-assembly is configured such that the transmitted composite laser beam illuminates the array of photodetectors in a direction defined by two angles $\alpha$ and $\beta$ in a reference frame (Ox,Oy,Oz), such that the direction in which the radio beam is radiated is determined by two angles $\alpha'$ and $\beta'$ defined, in the reference frame (Ox,Oy,Oz), by the relationships:

$$\alpha' \approx a \cdot \theta + c \cdot \alpha \text{ and } \beta' \approx b \cdot \psi + d \cdot \beta$$

where a, b, c and d have the value −1 or 1;
$\theta$ and $\psi$ being the angles defining the deflection imposed on the radio beam by the phase law generated by the signal generator sub-assembly.

According to one particular configuration of the device according to the invention considered in the previous embodiment, the panel bearing the array of photodetectors and the array of radiating elements has two axes of symmetry intersecting at a center itself forming a center of symmetry. The array of photodetectors and the array of radiating elements are electrically linked by an interconnection structure connecting the output of each photodetector to the radiating element situated in a cell symmetrical to the cell in which it is located about the center of symmetry or one of the axes of symmetry.

According to a first embodiment of this configuration, the panel bearing the array of photodetectors and the array of radiating elements comprises a plurality of cells, arranged in 2K columns placed on either side of a first axis of symmetry and 2L rows, on either side of a second axis of symmetry perpendicular to the first axis of symmetry and intersecting the latter at a point O of the panel. The output of the photodetector of a cell $C_{k,l}$ delivers its electrical signal to the radiating element of the cell $C_{-k,-l}$ symmetrical to the cell $C_{k,l}$ about the center of symmetry O.

According to one alternative embodiment, the panel bearing the array of photodetectors and the array of radiating elements comprises a plurality of cells, arranged in 2K columns placed on either side of a first axis of symmetry and 2L rows, on either side of a second axis of symmetry perpendicular to the first axis of symmetry and intersecting the latter at a point O of the panel. The output of the photodetector of a cell $C_{k,l}$ delivers its electrical signal to the radiating element of the cell $C_{k,-l}$ symmetrical to the cell $C_{k,l}$ about the first axis of symmetry.

According to another alternative embodiment, the panel bearing the array of photodetectors and the array of radiating elements comprises a plurality of cells, arranged in 2K columns placed on either side of a first axis of symmetry and 2L rows, on either side of a second axis of symmetry perpendicular to the first axis of symmetry and intersecting the latter at a point O of the panel. The output of the photodetector of a cell $C_{k,l}$ delivers its electrical signal to the radiating element of the cell $C_{-k,l}$ symmetrical to the cell $C_{k,l}$ about the second axis of symmetry.

According to another particular configuration of the device according to the invention, the panel bearing the array of photodetectors and the array of radiating elements comprises a plurality of cells, arranged in 2K columns placed on either side of a first axis of symmetry and 2L rows, on either side of a second axis of symmetry perpendicular to the first axis of symmetry and intersecting the latter at a point O of the panel. The output of the photodetector of a cell $C_{k,l}$ delivers its electrical signal to the radiating element belonging to the same cell $C_{k,l}$.

According to another embodiment of the device according to the invention, the array of photodetectors and the array of radiating elements are borne by two separate panels formed of cells arranged in columns k and rows l, each cell of a first panel comprising a photodetector and each cell of a second panel comprising a radiating element. The signal generator sub-assembly is configured such that the transmitted composite laser beam illuminates the array of photodetectors in a direction defined by two angles $\alpha$ and $\beta$ in a reference frame (Ox,Oy,Oz), such that the direction in which the radio beam is radiated is determined by two angles $\alpha'$ and $\beta'$ defined, in a reference frame (Ox',Oy',Oz') homologous with the reference frame (Ox,Oy,Oz), by the relationships:

$$\alpha' \approx a \cdot \theta + c \cdot \alpha \text{ and } \beta' \approx b \cdot \psi + d \cdot \beta$$

where a, b, c and d have the value −1 or 1;
$\theta$ and $\psi$ being the angles defining the deflection imposed on the radio beam by the phase law generated by the signal generator sub-assembly.

According to another embodiment, the device according to the invention comprises a plurality of transmission sub-assemblies and a signal generator sub-assembly, said signal generator being configured so as to produce a composite laser beam able to be directed onto the array of photodetectors of one or the other of the transmission sub-assemblies.

BRIEF DESCRIPTION OF THE DRAWINGS

The features and advantages of the invention will be better appreciated by virtue of the following description, which description draws on the appended figures, in which.

It should be noted that, in the appended figures, the same functional or structural element preferably bears the same reference symbol.

DETAILED DESCRIPTION

Figure 1:
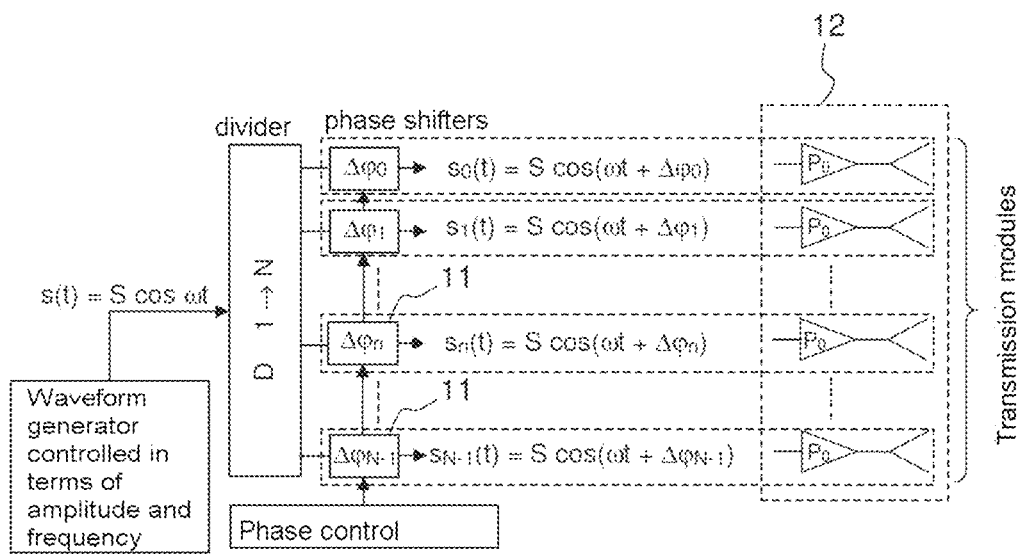
FIGS. 1 and 2 show schematic illustrations of two exemplary architectures of conventional radio stimulation devices forming part of the prior art.
Figure 2:
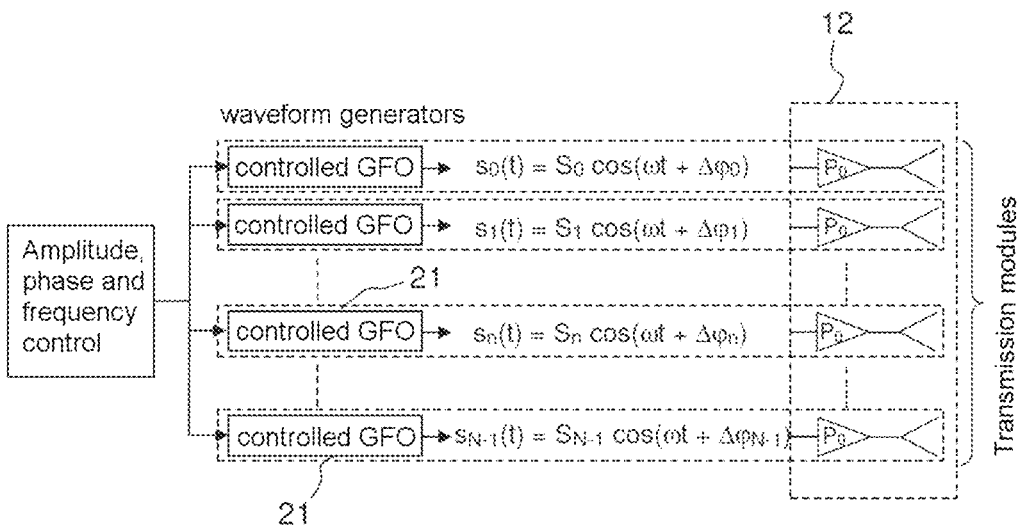
Figure 3:
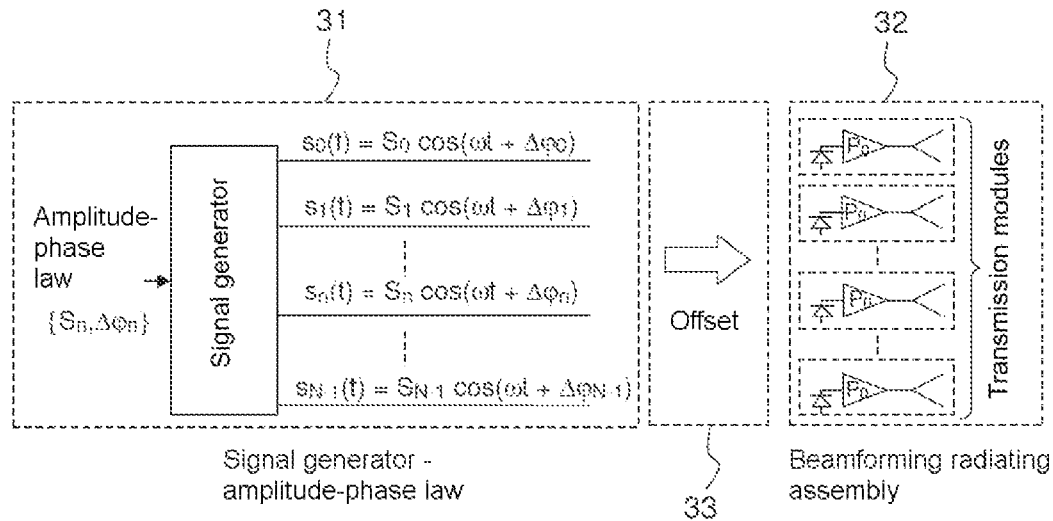
FIG. 3 shows a schematic illustration of the principle of physical separation of the radiation and waveform generation modules from one another.
Figure 4:
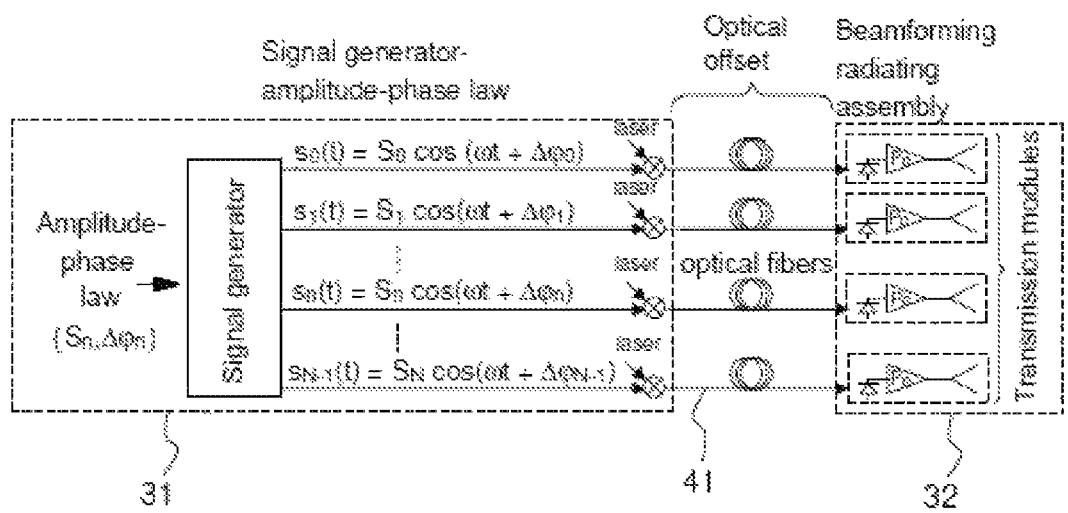
FIG. 4 shows a schematic illustration of one known exemplary implementation of the principle of FIG. 3.
Figure 5:
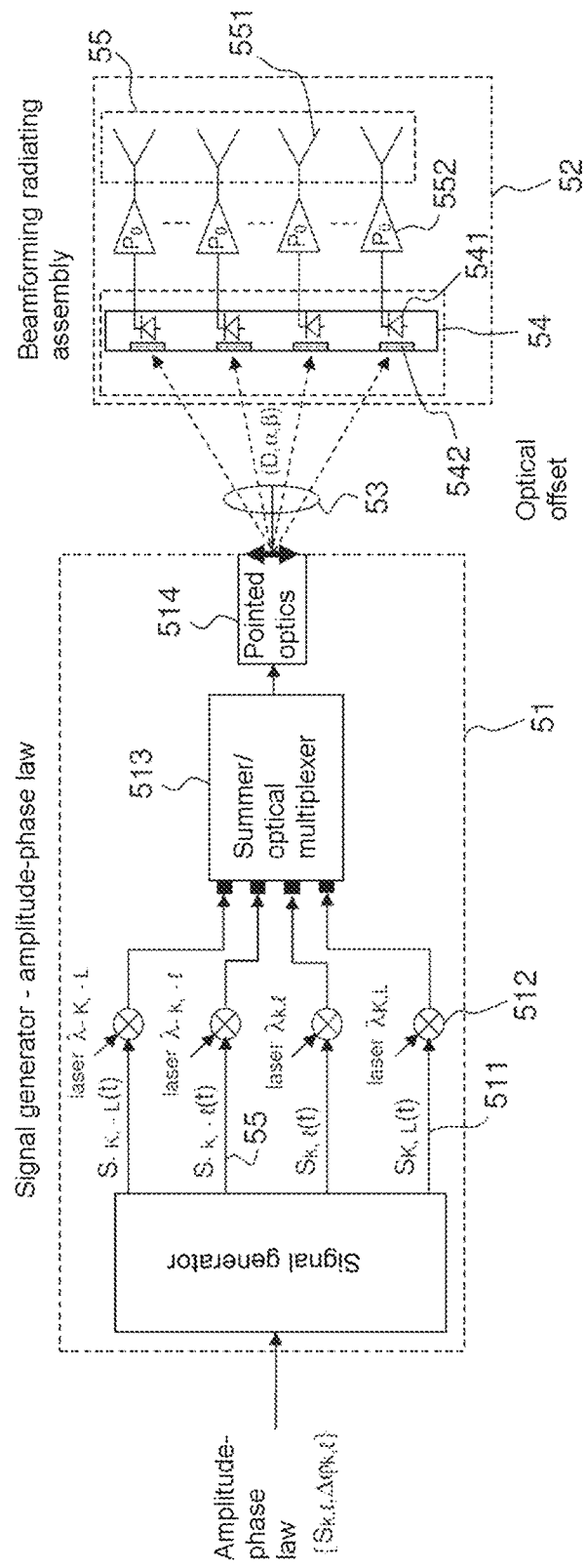
FIG. 5 shows a schematic illustration showing a stimulation device to which the principle of the invention may be applied.

FIG. 5 schematically shows the structure of a device for stimulating an antenna capable of being able to integrate the invention.

Such a device comprises, as is conventional, an electrical signal generator 51 and a transmission assembly 52 whose function is to radiate the signals produced by the generator 51 so as to form a radio beam directed toward the antenna to be tested.

The transmission assembly 52 consists of N radiating elements 551 (antennas) forming an array 55, generally planar, each supplied with power by a power amplifier module 552.

The signal generator 51 is configured so as to produce N electrical signals 511 that are coherent with one another and each have, with respect to a reference signal, a phase (phase shift) determined by a phase law also transmitted to the generator 51 or stored in an internal memory.

Each of the N produced signals is intended to supply power to one of the N radiating elements 551 (via its amplifier module 552). Recombination in space of the N signals 511, each radiated by an element 53, makes it possible to form a beam in a given direction, as a function of the phase law generated by the generator 51.

The phase of each electrical signal 511 produced by the generator 51 is determined as a function of the radiating element 551 for which it is intended and of the deflection that it is desired to impose on the beam that is formed with respect to a chosen reference axis, the axis perpendicular to the plane of the radiating elements for example.

The stimulation device under consideration here however originally has the particular feature of transmitting the electrical signals 511 produced by the signal generator 51 to the transmission assembly 52 in the form of a composite laser beam 53 formed of N multiplexed light waves, of different wavelengths, each light wave being modulated by one of the N electrical signals that are produced. To this end, the signal generator 51 comprises N electro-optical modulators 512, an optical multiplexer 513 and a lens forming pointed optics 514.

The composite laser beam 53 is oriented toward the transmission assembly 52, which comprises a set of N photodetectors 541. The photodetectors 541 are arranged in an arrangement forming a planar structure 54, illuminated by the laser beam 53 at a given incidence relative to the normal Oy to this structure.

Each photodetector 541 is also associated with a light wavelength filter 542, configured such that it is able to detect only the light wave modulated by the electrical signal 511 that is intended therefor.

According to the invention, the transmission sub-assembly 52 according to the invention has the advantageous feature that the arrangement of the photodetectors 541 on the array structure 54 has a geometry identical to the arrangement of the radiating elements 551 on the array structure 55. Identical geometry is understood here to mean that the shape of the alignment of the elements on each of the structures 54 and 55 and the alignment pitches are identical. This identity between the geometries constitutes the essential feature of the invention.

This particular structural feature is reflected in the fact that each photodetector 541 occupying a given position in the arrangement of the array 54 of the N photodetectors has a corresponding radiating element 551 occupying an identical position in the arrangement of the array of the N radiating elements 551, these positions being for example defined by identical coordinates in the orthonormal reference frames respectively attached to each of the arrangements.

This geometrical identity has the advantageous result that the radio beam formed by the arrangement of radiating elements 55, with respect to the normal to the plane of the radiating elements, substantially has a deflection whose value is equal, with an error term, to the direction of deflection of the radio beam determined by the phase law imposed on the generator 51 plus a direction linked directly to the direction of incidence of the composite laser beam on the arrangement 54 of photodetectors.

The direction of the radiated radio beam is thus no longer referenced in absolute terms with respect to a reference direction of the arrangement of the radiating elements, but in relative terms with respect to the direction of incidence of the composite laser beam.

This advantageous result is more particularly obtained for a direction of incidence of the laser beam contained within a limited angular range and a direction of deflection of the radio beam also contained within a limited angular range, for which the error term remains acceptable for the application under consideration. Beyond these ranges, the error term may adopt a value considered unacceptable for the application under consideration.

The remainder of the description presents exemplary embodiments implementing the invention and in which the transmission sub-assemblies comprise photodetectors 541 and radiating elements 551 arranged in respective arrangements having identical geometries.

Figure 6:
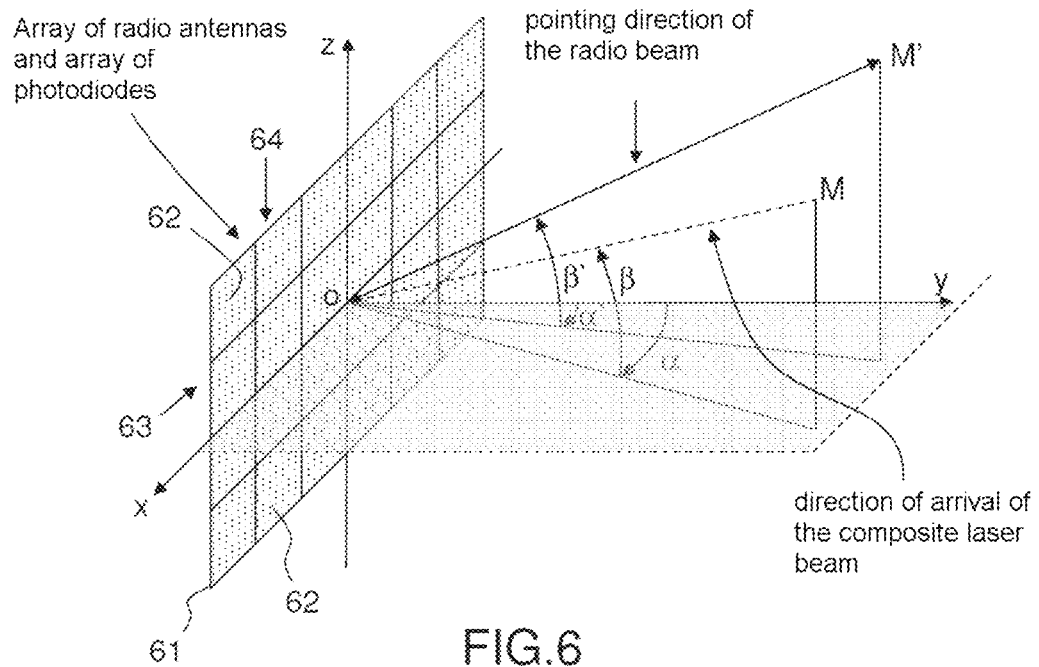
FIGS. 6 and 7 show schematic depictions of one form of implementation of the invention highlighting the essential features thereof.
Figure 7:
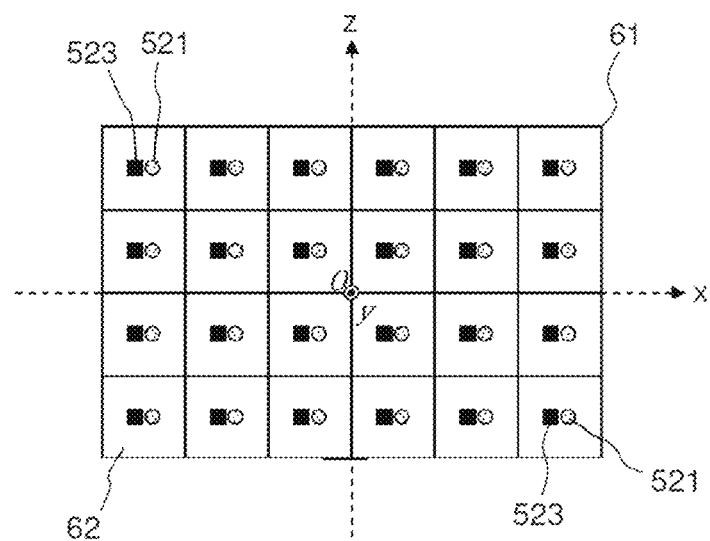

FIGS. 6 and 7 schematically show a first exemplary structure intended to form a transmission assembly 52 according to the invention. This structure is common to the various exemplary embodiments described in the remainder of the text having such a feature.

In this structure, the photodetectors 541, photodiodes for example, and the radiating elements 551 are arranged in a plane (xOz) 61 consisting of elementary cells 62, in an orthogonal arrangement. Each cell 62 comprises a photodetector 541 and a radiating element 551 that are situated in the vicinity of one another, the active areas of the two elements being oriented in one and the same direction. The photodetectors 541 fitted to the cells 62, photodiodes for example, are each provided with a specific optical filter 542 allowing the passage only of the wavelength $\lambda_{k,l}$ that is dedicated thereto.

The cells 62 are surfaces that may be rectangular, but they will generally be more of a square. They are arranged in rows placed on either side of a first axis of symmetry, the axis (Ox), and in columns placed on either side of a second axis of symmetry, the axis (Oz), in a distribution having the point O of intersection of the two axes as center of symmetry.

The arrangement of the antennas 551 and of the photodiodes 541 on the elementary cells 62 is moreover the same for each cell, such that the two arrays have one and the same geometry. They are however slightly offset in one or other of the directions of the plane (xOz).

Depending on the shape of the array of radiating elements (and therefore of the array of photodiodes), the number of cells in the rows and in the columns may be constant or vary from one column or row to the adjacent column or row.

Thus, if the two arrays have a rectangular shape, the cells are for example arranged in 2L rows 63 on either side of a first axis of symmetry, the axis (Ox), and 2K columns 64 placed on either side of a second axis of symmetry, the axis (Oz), in a distribution having the point O of intersection of the two axes as center of symmetry.

In other words, the structure in this case comprises 4KL cells 62 arranged in K columns on either side of the axis (Ox) and in L rows on either side of the axis (Oy), so as to give $\overrightarrow{OC}_{-k,-l} = \overrightarrow{OC}_{k,l}$, $C_{k,l}$ representing the center of the cell situated in the row k and the column l. This cell arrangement thus has dual axial symmetry about an axis Ox and an axis Oz, the point O forming a center of symmetry.

As an alternative, if the two arrays have a non-rectangular shape, a circular or elliptical shape for example, the cells 62 may also be arranged in an orthogonal arrangement. However, the number of cells 62 in a row or a column is then different depending on the position of the row or of the column with respect to the axes of symmetry, a column k or a row l comprising fewer cells 62 the further away it is from an axis of symmetry.

In addition to electric power supply and service circuits, not shown in FIGS. 6 and 7, the transmission assembly 52 comprises a set of identical power amplifiers 552 of a number identical to the number of radiating elements 551.

Each power amplifier receives its input signal from a photodiode 541 of the photodiode array 54 and delivers an amplified signal to an antenna of the radio antenna array 55. The outputs of the photodiodes 541 are connected to the inputs of the amplifier modules 552, the outputs of which are themselves connected to radiating sources 551.

Preferably, in order to minimize power losses, the power amplifiers 5524 are placed as close as possible to the radio antennas 551.

In a structure such as the one illustrated in FIGS. 6 and 7, with the elements of the arrays of radio antennas (radiating elements 551) and of photodetectors (photodiodes 541) belonging to the same cells 62, the radiation of the radio beam and the illumination of the array of photodiodes by the composite laser beam take place in one and the same direction in space with respect to the plane 61 of the arrays.

The photodiodes 541 and the antennas 551 are referenced in the same way in their respective arrays, by two indices k along the axis Ox and l along the axis Oz, which, for reasons of symmetry, each progress positively from 1 to a specific positive maximum value and negatively from −1 to a minimum value opposite the specific positive maximum value.

Thus, the antenna 551 and the photodiode 541 with its filter 542 belonging to one and the same cell $C_{k,l}$, of indices (k,l), are called $A_{k,l}$ and $P_{k,l}$, respectively.

It will be noted here that, if the arrays 54 and 55 are full rectangles, the minimum and maximum values are respectively −K and K in x and −L and L in z, K and L being positive integers. On the other hand, if the arrays are elliptical or circular, the limits in terms of rows or columns are not as easy to express because they depend respectively on the column or the row.

As illustrated in FIG. 6, such a structure therefore receives the composite laser beam 53 transmitted by the generator 51 in a given incident direction 65 and radiates a radio beam in a given transmission direction 66.

Let α and β be the angles corresponding to the projection of the direction 65 of arrival of the laser beam 53 respectively on a plane (xOy), in which Oy represents the normal to the plane 61 passing through the center of symmetry O of the structure, and on the plane (xOz).

Also let α' and β' be the angles corresponding to the projection of the direction 66 of transmission of the radio beam radiated by the transmission sub-assembly 52, respectively in the same planes.

The values of the angles α' and β' are determined by the value of the phase law carried by the various light waves forming the composite laser beam plus the phase shifts affecting the waves received by the various photodiodes due to the direction of incidence (α,β) of the composite laser beam 53.

In accordance with what has been stated above, due to the fact that, characteristically, the arrays that form the transmission sub-assembly 52 have one and the same geometry, the direction 66 in which the radio beam is transmitted corresponds to the direction of deflection imposed by the phase law generated by the generator 51 plus a direction linked directly to the direction 65 of arrival (α,β) of the laser beam.

More precisely, if the angles θ and ψ define this direction of deflection, these corresponding to the projection of the direction of transmission of the radio beam radiated by the transmission sub-assembly 52, respectively in the planes (xOy) and (xOz), it is possible to write:

$$\alpha' \approx a \cdot \theta + c \cdot \alpha \qquad [001]$$

and $$\beta' \approx b \cdot \psi + d \cdot \beta \qquad [002]$$

where a, b, c and d have the value −1 or 1.

According to the invention, the values, 1 or −1, of the coefficients a, b, c and d are determined by the interconnection links created between the photodiodes 541 and the electromagnetic antennas 551 for the application under consideration, each photodiode 541 being connected to a radiating element 551 by way of an amplifier element 552. In the remainder of the description, a description is given of various wiring variants that may be created within the framework of the structure of FIGS. 6 and 7.

Figure 8:
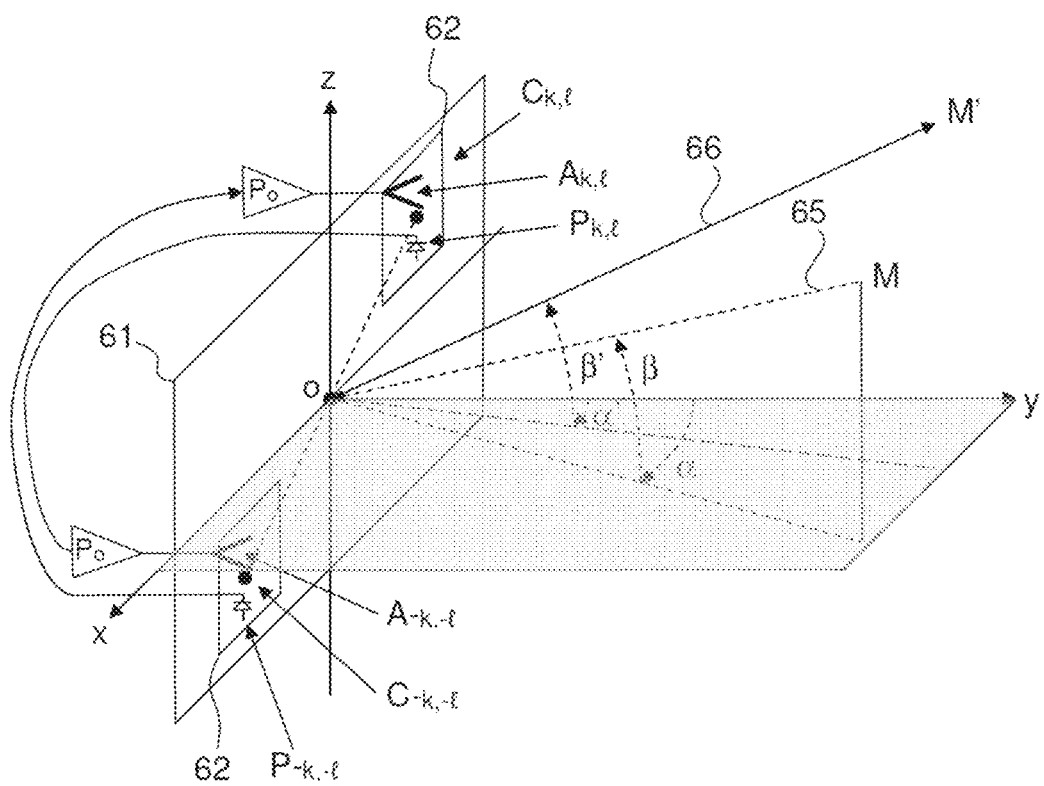
FIG. 8 shows an illustration relating to a first exemplary embodiment of the form of implementation in FIGS. 6 and 7.

FIG. 8 illustrates a first exemplary embodiment in which a photodiode 541 $P_{k,l}$ belonging to a cell $C_{k,l}$ delivers its electrical signal to the radiating element 551 $A_{-k,-l}$ belonging to the cell occupying a position symmetrical to the cell $C_{k,l}$ about the center O in the structure.

Considering the structure illustrated by FIGS. 6 and 7, the formation of a radio beam in the direction $(\alpha',\beta')$, 67, by the array 55 of radio antennas, arranged with a pitch δ in x and in y, corresponds to the following phase law:

$$\Delta\varphi'_{-k,-l} = \frac{2\pi\delta}{\lambda}\left[\left(k-\frac{1}{2}\right)\sin\alpha'\cos\beta' + \left(l-\frac{1}{2}\right)\sin\beta'\right] \qquad [003]$$

and $$\Delta\varphi'_{k,l} = -\frac{2\pi}{\lambda}\left[\left(k-\frac{1}{2}\right)\sin\alpha'\cos\beta' + \left(l-\frac{1}{2}\right)\sin\beta'\right] = -\Delta\varphi'_{-k,-l} \qquad [004]$$

where $\Delta\varphi'_{-k,-l}$ and $\Delta\varphi'_{k,l}$ respectively represent the phase shifts of the radio signals radiated by the radiating element situated in the cell $C_{-k,-l}$ and by the one situated in the cell $C_{k,l}$, λ being the radio wavelength in air.

The direction of arrival $(\alpha,\beta)$ of the composite laser beam 53 on the array of photodiodes 54 produces the following phase law on the carried electrical signal:

$$\Delta\varphi_{-g,-l} = -\frac{2\pi\delta}{\lambda}\left[\left(k-\frac{1}{2}\right)\sin\alpha\cos\beta + \left(l-\frac{1}{2}\right)\sin\beta\right]$$

and $$\Delta\varphi_{k,l} = \frac{2\pi\delta}{\lambda}\left[\left(k-\frac{1}{2}\right)\sin\alpha\cos\beta + \left(l-\frac{1}{2}\right)\sin\beta\right] = -\Delta\varphi_{-k,-l}$$

The composite laser beam 53 transmitted to the array of photodiodes 54 carries a phase law that, if it were to be applied directly and normally to the array 55 of radio antennas, would produce a radio beam in the direction $(\theta,\psi)$, the angles θ and ψ being connected to the previous phase law by the relationships:

$$\Delta\varphi^P_{-k,-l} = \frac{2\pi\delta}{\lambda}\left[\left(k-\frac{1}{2}\right)\sin\theta\cos\psi + \left(l-\frac{1}{2}\right)\sin\psi\right] \qquad [005]$$

and $$\Delta\varphi^P_{k,l} = -\frac{2\pi\delta}{\lambda}\left[\left(k-\frac{1}{2}\right)\sin\psi\cos\theta + \left(l-\frac{1}{2}\right)\sin\psi\right] = -\Delta\varphi^P_{-k,-l} \qquad [006]$$

In addition, the connection of the electrical output of each photodiode $P_{k,l}$ to the input of the amplifier 552 that delivers its power to the radio antenna $A_{-k,-l}$ generates a radio beam whose direction is defined by the following phase law:

$$\Delta\varphi'_{-k,-l} = \Delta\varphi_{k,l} + \Delta\varphi^P_{k,l} \qquad [007]$$

and $$\Delta\varphi'_{k,l} = \Delta\varphi_{-k,-l} + \Delta\varphi^P_{-k,-l} \qquad [008]$$

As a result, the equation connecting the three directions $(\alpha',\beta')$, $(\alpha,\beta)$ and $(\theta,\psi)$ is deduced directly from the above:

$$\frac{2\pi\delta}{\lambda}\left[\left(k-\frac{1}{2}\right)\sin\alpha'\cos\beta' + \left(l-\frac{1}{2}\right)\sin\beta'\right] = \qquad [009]$$
$$\frac{2\pi\delta}{\lambda}\left[\left(k-\frac{1}{2}\right)\sin\alpha\cos\beta + \left(l-\frac{1}{2}\right)\sin\beta\right] -$$
$$\frac{2\pi\delta}{\lambda}\left[\left(k-\frac{1}{2}\right)\sin\theta\cos\psi + \left(l-\frac{1}{2}\right)\sin\psi\right]$$

The independence in terms of k and in terms of l leads, in the light of the above equations, to the following solution:

$$\sin\beta' = \sin\beta - \sin\psi \qquad [010]$$

and $$\sin\alpha'\cos\beta' = \sin\alpha\cos\beta - \sin\theta\cos\psi \qquad [011]$$

Which may also be written as:

$$\beta' = \mathrm{Arcsin}(\sin\beta - \sin\psi) \qquad [012]$$

and $$\alpha' = \mathrm{Arcsin}\left(\frac{\sin\alpha\cos\beta - \sin\theta}{\sqrt{1-(\sin\beta-\sin\psi)^2}}\right) \qquad [013]$$

Considering the above relationships, it is observed that, if the direction given by the phase law $(\theta,\psi)$ carried by the composite laser beam is equal $(\theta,\psi)=(0,0)$ (equiphase distribution), this gives $(\alpha',\beta')=(\alpha,\beta)$.

It is then observed that the transmission sub-assembly 52 has retrodirective properties similar to those of a Van Atta radiating array, which is also known, except that the device according to the invention is not an entirely radio device, but a hybrid optical-radio device.

The direction of transmission 66 of the radio beam is then unconditionally equal to the direction of arrival 65 of the composite laser beam 53, the directions of propagation being opposite to one another.

On the other hand, if the direction given by the phase law carried by the composite laser beam is $(\theta,\psi)\neq(0,0)$, relationships [012] and [013] are no longer simplified as in the previous case.

However, it is still possible to express the angles α' and β' defining the direction of the formed radio beam as follows:

$$\beta' = (\beta-\psi) + [\mathrm{Arcsin}(\sin\beta - \sin\psi) - (\beta-\psi)] \qquad [014]$$

$$\alpha' = (\alpha-\theta) + \left[\mathrm{Arcsin}\left(\frac{\sin\alpha\cos\beta - \sin\theta}{\sqrt{1-(\sin\beta-\sin\psi)^2}}\right) - (\alpha-\theta)\right] \qquad [015]$$

Therefore, considering the two functions $\varepsilon_{\Delta\beta}(\Psi,B)$ and $(\Theta,\psi,A,B)$ defined by the following relationships:

$$\varepsilon_{\Delta\beta}(\Psi, B) = \text{Arcsin}(\sin B + \sin \Psi) - (B + \Psi) \quad [016]$$

$$\varepsilon_{\Delta\alpha}(\Theta, \Psi, A, B) = \text{Arcsin}\left(\frac{\sin A \cos B + \sin \Theta}{\sqrt{1-(\sin B + \sin \Psi)^2}}\right) - ((A + \Theta)) \quad [017]$$

By taking $A=\alpha$, $B=\beta$, $\Theta=\theta$ and $\psi=-\psi$, it is possible to write:

$$\Delta\beta = \beta' - \beta = -\psi + \varepsilon_{\Delta\beta}(-\psi, \beta) \quad [018]$$

and $$\Delta\alpha = \alpha' - \alpha = -\theta + \varepsilon_{\Delta\alpha}(-\theta, -\psi, \alpha, \beta) \quad [019]$$

It is thus observed that, in the case of a phase law carried by any composite laser beam 53, corresponding to a direction $(\theta,\psi)$, the direction 66 of transmission of the radio beam then corresponds to the opposite direction $(-\theta,-\psi)$, carried by the direction of arrival 66 of the composite laser beam, with an error term that is able to be calculated from the values of $\theta$, $\psi$, $\alpha$ and $\beta$.

Therefore, as long as the error terms $\varepsilon_{\Delta\beta}(-\psi,\beta)$ and $\varepsilon_{\Delta\alpha}(-\theta,-\psi,\alpha,\beta)$ are able to be neglected, this then gives:

$$\beta' \approx -\psi + \beta \text{ and } \alpha' \approx -\theta + \alpha \quad [020]$$

The interconnection structure illustrated by FIG. 8 therefore makes it possible to therefore produce a radio beam in the direction $(\alpha',\beta') \approx (-\theta+\alpha,-\psi+\beta)$ in the reference frame $(O',x',y',z')$ of the array of radiating elements, which is coincident here with the reference frame $(O,x,y,z)$ of the array of photodiodes.

The geometrical identity of the arrays of photodiodes and of radiating elements thus advantageously makes it possible to overcome the need to calculate, for each value of the phase law, the correction term to be applied in order to obtain a radio beam whose direction 66 does not depend on the direction 65 of incidence of the laser beam.

The error terms may be determined analytically from relationships [016] and for selected values of the angles $\theta$, $\psi$, $\alpha$ and $\beta$. It is thus possible to form a table giving the value of these error terms as a function of the values of the angles $\theta$, $\psi$, $\alpha$ and $\beta$ and thus to determine, for a given application, the extents of the angular ranges of the angles $\theta$, $\psi$, $\alpha$ and $\beta$ for which the error terms $\varepsilon_{\Delta\beta}(-\psi,\beta)$ and $\varepsilon_{\Delta\alpha}(-\theta,-\psi,\alpha,\beta)$ remain acceptable for the application under consideration.

Figure 9:
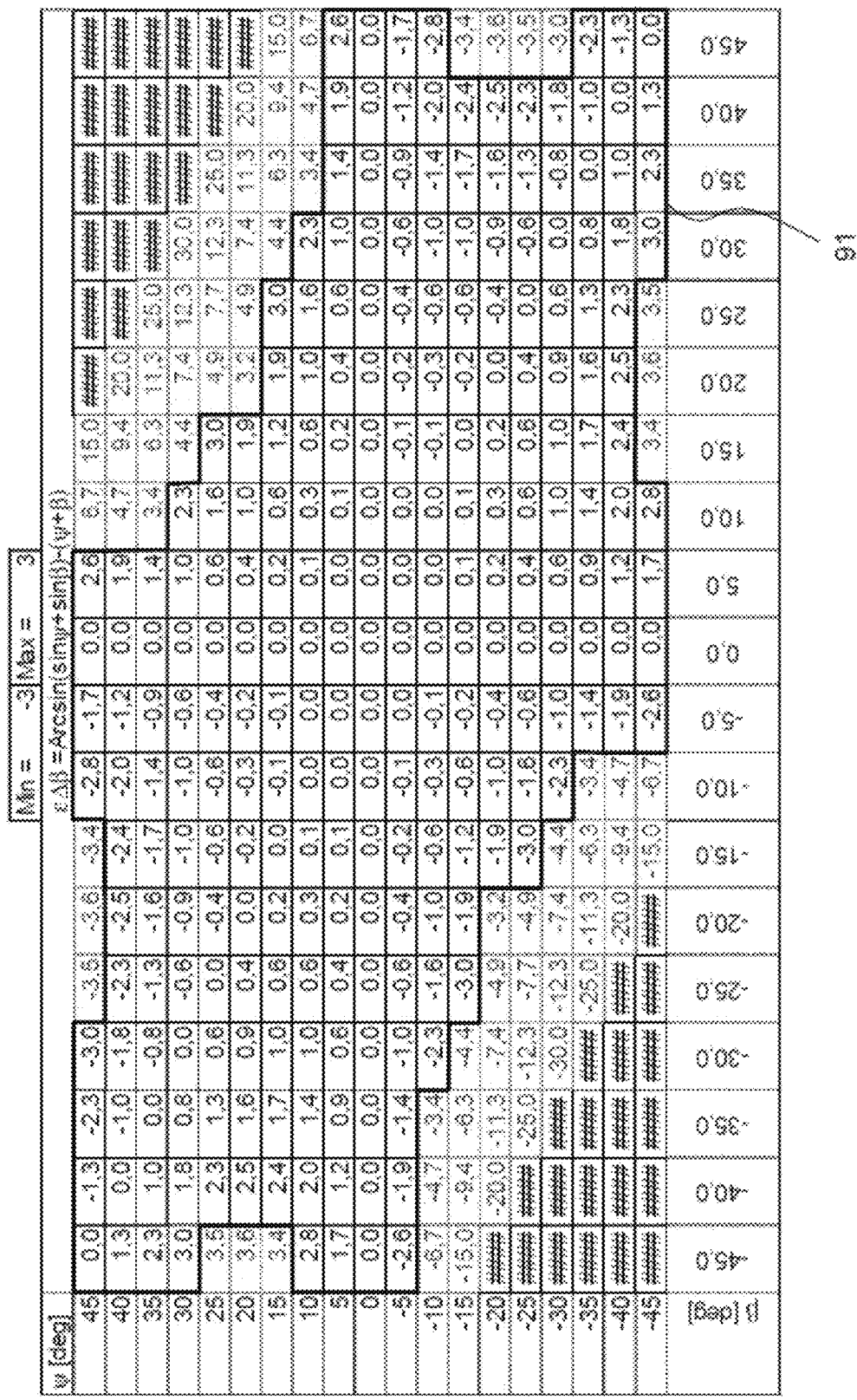
FIGS. 9 and 10 show two tables for defining the angular range of validity of the invention for the exemplary implementation of FIG. 8.

FIG. 9 shows, for the exemplary embodiment of FIG. 8, the table of the values of $\varepsilon_{\Delta\beta}(-\psi,\beta)$ for $\psi$ and $\beta$ varying between $+45°$ and $-45°$. This table makes it possible to determine the angular values of $\psi$ and $\beta$ defining a range 91 within which $\varepsilon_{\Delta\beta}(-\psi,\beta)$ remains between given limit values, between $\pm 3°$ for example.

Figure 10:
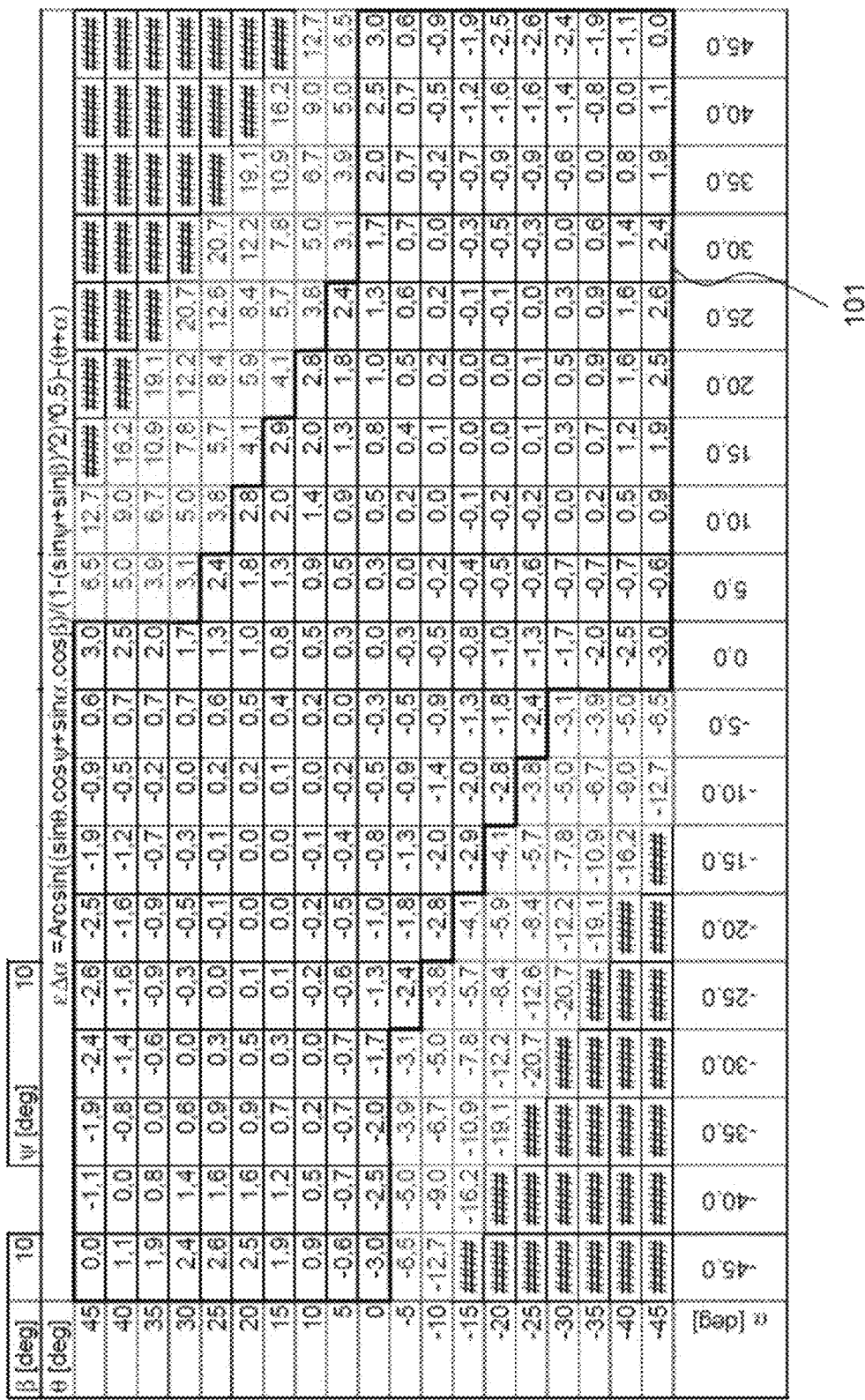

Similarly, FIG. 10 shows, for the exemplary embodiment of FIG. 8, the table of the values of $\varepsilon_{\Delta\alpha}(-\theta,-\psi,\alpha,\beta)$ for $\alpha$ and $\theta$ varying between $+45°$ and $45°$. The table in FIG. 10 is given for $\psi=10°$ and $\beta=10°$. It makes it possible to determine the angular values of $\alpha$ and $\theta$ defining a range 101, which $\varepsilon_{\Delta\alpha}(-\theta,-\psi,\alpha,\beta)$ remains between given limit values, between $\pm 3°$ for example.

Thus, as illustrated by FIGS. 9 and 10, the angular range within which the invention shows its usefulness to the greatest extent is perceived by virtue of the two errors $\varepsilon_{\Delta\alpha}$ and $E_{\Delta\beta}$, calculated beforehand in the general two-dimensional case.

It should be noted that the error $E_{\Delta\beta}$, since it depends only on two parameters, $\psi$ and $\beta$, is easily perceived.

On the other hand, the error $\varepsilon_{\Delta\alpha}$ that depends on the four parameters $\theta$, $\psi$, $\alpha$ and $\beta$, is perceived less easily.

However, a statistical study shows that, for example for the four parameters $\theta$, $\psi$, $\alpha$ and $\beta$, evolving in $\pm 15°$, $\varepsilon_{\Delta\alpha}$ varies between $\pm 5.8°$ with a standard deviation of $0.80°$, while $\varepsilon_{\Delta\beta}$ varies between $\pm 1.2°$ with a standard deviation of $0.35°$. It is thus possible to conclude that an interval of $\pm 15°$ for each of the four parameters $\theta$, $\psi$, $\alpha$ and $\beta$ forms an angular range for implementing the invention, even with an aperture of the formed radio beam of approximately $6°$ in its two dimensions.

It should also be noted that the tabulation in FIG. 9 is also applicable for the case of a one-dimensional system (arrays formed of photodiodes or radiating elements aligned along Ox for example). It is concluded from this for example that, in such a case:

for ranges of $\alpha$ and $\theta$, or $\beta$ and $\psi$, of $\pm 25°$, $\varepsilon_{\Delta\alpha}$ or respectively $\varepsilon_{\Delta\beta}$ reaches extrema of $\pm 7.7°$ with a standard deviation of $1.36°$;

for ranges of $\alpha$ and $\theta$, or $\beta$ and $\psi$, of $\pm 20°$, $\varepsilon_{\Delta\alpha}$ or respectively $\varepsilon_{\Delta\beta}$ reaches extrema of $\pm 3.2°$ with a standard deviation of $0.63°$.

The detailed explanation of the principle of the invention developed above for the exemplary application of FIG. 8, which shows a particular interconnection configuration in which the photodiode $P_{k,l}$ of the cell $C_{k,l}$ delivers its electrical signal to the radio antenna $A_{-k,-l}$ of the cell $C_{-k,-l}$ symmetrical to $C_{k,l}$ about O, may naturally be extended to other configurations of connections between the photodiodes 541 and the radiating elements 551.

The remainder of the text presents, without limitation, other exemplary embodiments having other interconnection configurations. For these other exemplary implementations, mention is made simply of the expression of the angles $\beta'$ and $\alpha'$ without going into the details of the calculations leading to these results, which calculations are similar to those already developed.

Figure 11:
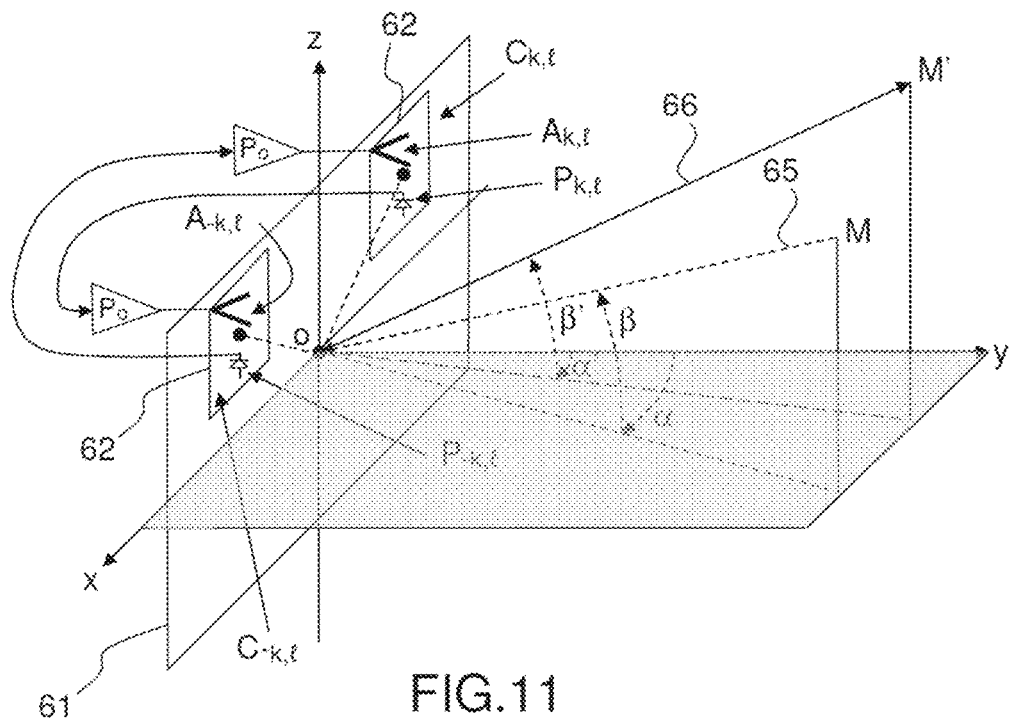
FIGS. 11 and 12 show illustrations relating to a second and a third exemplary embodiment of the form of implementation in FIGS. 6 and 7.

FIG. 11 illustrates a second exemplary embodiment implementing the structure illustrated by FIGS. 6 and 7, in which a photodiode 541 $P_{k,l}$ belonging to a cell $C_{k,l}$ delivers its electrical signal to the radiating element 551 $A_{-k,l}$ belonging to the cell $C_{-k,l}$ occupying a position symmetrical to the cell $C_{k,l}$ about the axis (Oz) in the structure.

Calculations similar to those described above regarding the interconnection structure illustrated by FIG. 8 show that the direction of transmission of the radio beam is also referenced with respect to a reference direction given by the angles $\alpha$ and $\beta$. The direction of transmission of the radio beam is then defined by the angles $\beta'$ and $\alpha'$ complying with the relationships:

$$\beta' \approx \psi - \beta \text{ and } \alpha' \approx -\theta + \alpha \quad [021]$$

In other words, such an interconnection structure produces a radio beam in the direction $(\alpha',\beta') \approx (-\theta+\alpha,\psi-\beta)$ in the reference frame $(O',x',y',z')$ of the array of radiating elements, which is coincident here with the reference frame $(O,x,y,z)$ of the array of photodiodes.

It is therefore possible to write, introducing the terms $\varepsilon_{\Delta\beta}$ and $\varepsilon_{\Delta\alpha}$:

$$\Delta\beta = \beta' + \beta = \psi + \varepsilon_{\Delta\beta}(\psi,-\beta) \quad [022]$$

and $$\Delta\alpha = \alpha' - \alpha = -\theta + \varepsilon_{\Delta\alpha}(-\theta,\psi,\alpha,-\beta) \quad [023]$$

the values of the error terms $\varepsilon_{\Delta\beta}(\psi,-\beta)$ and $\varepsilon_{\Delta\alpha}(-\theta,\psi,\alpha,-\beta)$ being calculated respectively using formulae [016] and [017], taking A=α, B=β, Θ=−θ and Ψ=ψ.

Figure 12:
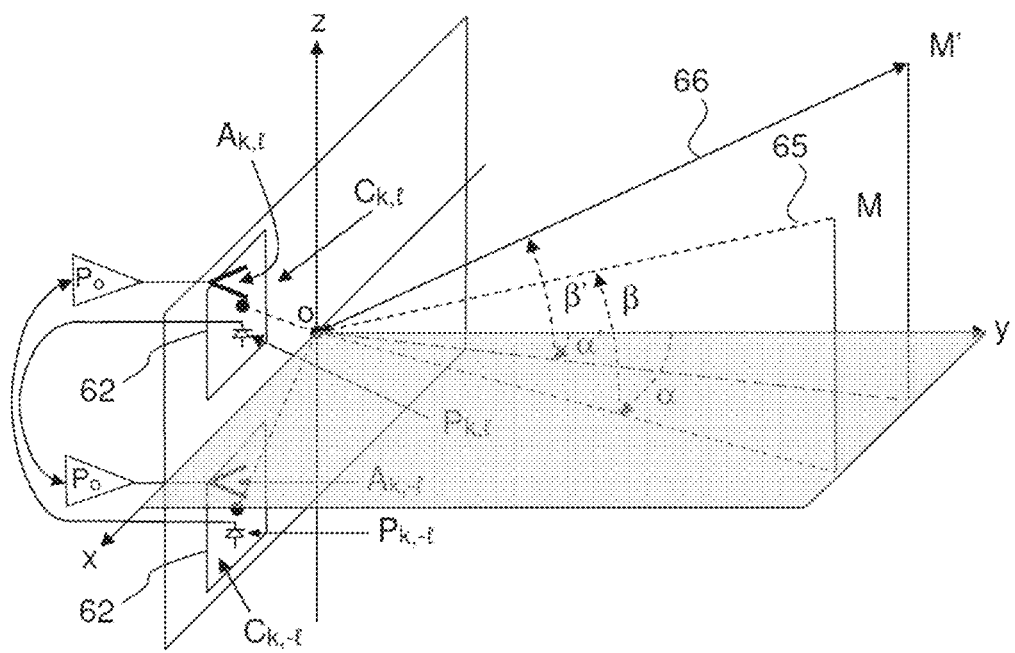

FIG. 12 illustrates a third exemplary embodiment implementing the structure illustrated by FIGS. 6 and 7, in which a photodiode 541 $P_{k,l}$ belonging to a cell $C_{k,l}$ is connected to the radiating element 551 $A_{k,-l}$ belonging to the cell $C_{k,-l}$ occupying a position symmetrical to the cell $C_{k,l}$ about the axis (Ox) in the structure.

As in the previous exemplary embodiment, calculations similar to those described above regarding the interconnection structure illustrated by FIG. 8 show that the direction of transmission of the radio beam is also referenced with respect to a reference direction given by the angles α and β. The direction of transmission of the radio beam is then defined by the angles β' and α' complying with the relationships:

$$\beta' \approx -\psi + \beta \text{ and } \alpha' \approx \theta - \alpha \quad [024]$$

In other words, such an interconnection structure produces a radio beam in the direction $(\alpha',\beta') \approx (\theta-\alpha,-\psi+\beta)$ in the reference frame (O',x',y',z') of the array of radiating elements, which is coincident here with the reference frame (O,x,y,z) of the array of photodiodes.

It is therefore possible to write, introducing the terms $\varepsilon_{\Delta\beta}$ and $\varepsilon_{\Delta\alpha}$:

$$\Delta\beta=\beta'-\beta=-\psi+\varepsilon_{\Delta\beta}(-\psi,\beta) \quad [025]$$

and $$\Delta\alpha=\alpha'+\alpha=\theta+\varepsilon_{\Delta\alpha}(\theta,-\psi,-\alpha,\beta) \quad [026]$$

the values of the error terms $\varepsilon_{\Delta\beta}(-\psi,\beta)$ and $\varepsilon_{\Delta\alpha}(\theta,-\psi,-\alpha,\beta)$ being calculated respectively using formulae [016] and [017], taking A=α, B=β, Θ=θ and Ψ=−ψ.

Figure 13:
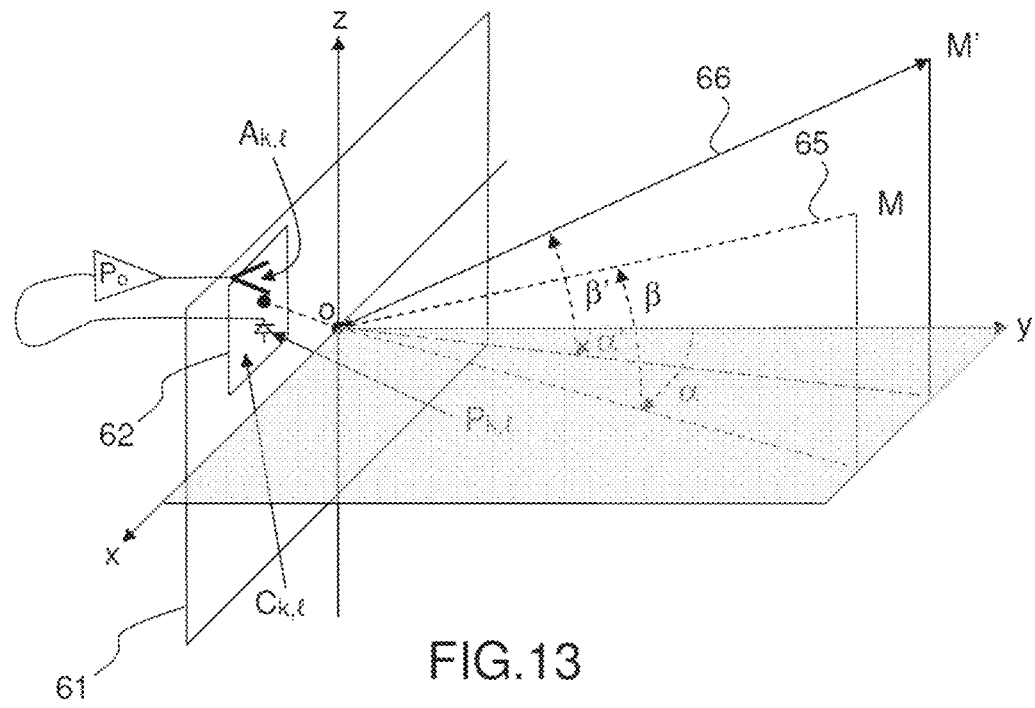
FIG. 13 shows an illustration relating to a fourth exemplary embodiment of the form of implementation in FIGS. 6 and 7.

FIG. 13 illustrates a fourth exemplary embodiment implementing the structure illustrated by FIGS. 6 and 7, in which a photodiode 541 $P_{k,l}$ belonging to a cell $C_{k,l}$ is connected to the radiating element 551 $A_{k,l}$ belonging to the same cell $C_{k,l}$ (lack of connection symmetry).

As in the previous exemplary embodiments, calculations similar to those described above regarding the interconnection structure illustrated by FIG. 8 show that the direction of transmission of the radio beam is also referenced with respect to a reference direction given by the angles α and β. The direction of transmission of the radio beam is then defined by the angles β' and α' complying with the relationships:

$$\beta' \approx \psi - \beta \text{ and } \alpha' \approx \theta - \alpha \quad [027]$$

In other words, such an interconnection structure produces a radio beam in the direction $(\alpha',\beta') \approx (\theta-\alpha,\psi-\beta)$ in the reference frame (O',x',y',z') of the array of radiating elements, which is coincident here with the reference frame (O,x,y,z) of the array of photodiodes.

It is therefore possible to write, introducing the terms $\varepsilon_{\Delta\beta}$ and $\varepsilon_{\Delta\alpha}$:

$$\Delta\beta=\beta'+\beta=\psi+\varepsilon_{\Delta\beta}(\psi,\beta) \quad [028]$$

and $$\Delta\alpha=\alpha'+\alpha=\theta+\varepsilon_{\Delta\alpha}(\theta,\psi,-\alpha,-\beta) \quad [029]$$

the values of the error terms $\varepsilon_{\Delta\beta}(\psi,-\beta)$ and $\varepsilon_{\Delta\alpha}(\theta,\psi,-\alpha,-\beta)$ being calculated respectively using formulae [016] and [017], taking A=−α, B=−β, Θ=θ and Ψ=ψ.

Figure 14:
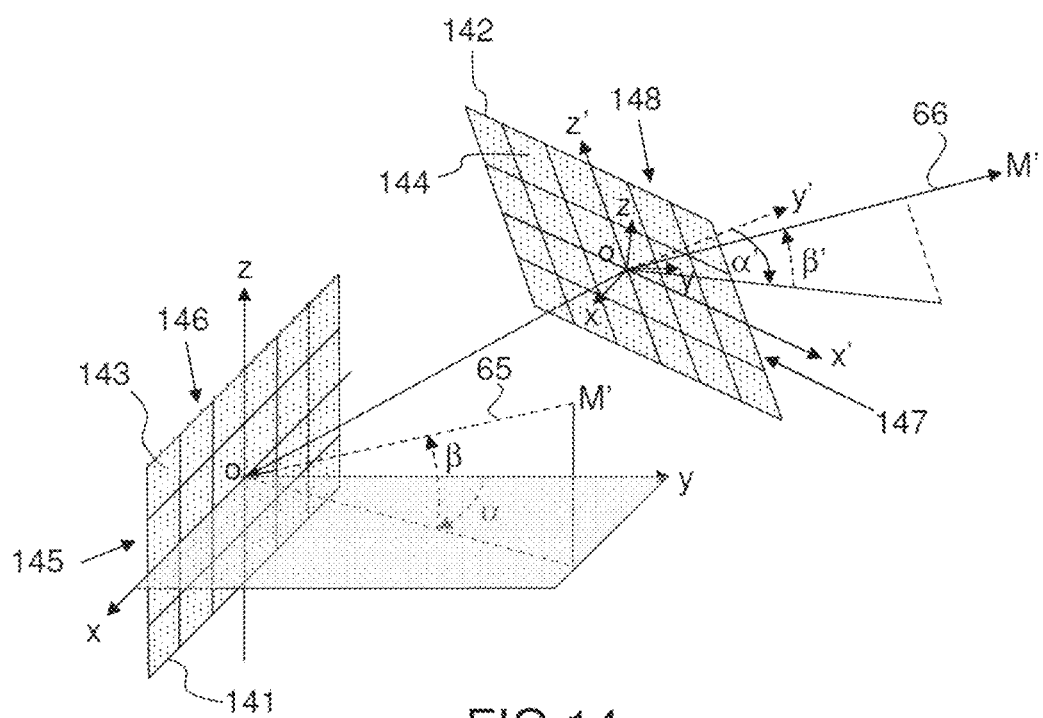
FIG. 14 shows a schematic depiction of another form of implementation of the invention in which the array of photodiodes and the array of radiating elements are on two independent supports.

FIG. 14 schematically shows a second embodiment of the transmission sub-assembly 52.

In this embodiment, the two arrays 54 (array of photodiodes 541) and 55 (array of radiating elements 551) forming the transmission sub-assembly 52 are borne by two separate planar structures 141 and 142, oriented in any way with respect to one another. However, they have identical geometries, such that the two structures are able to be broken down into cells of shapes and sizes, which are able to be referenced identically in homologous reference frames each forming a forward-facing trihedron for example. In this way, a cell $C_{k,l}$ of the array 54 containing a photodiode $P_{k,l}$ corresponds geometrically to a cell $C'_{k,l}$ of the array 55 containing an antenna $A_{k,l}$.

However, such a structure does not differ in any way from a functional point of view from the structure described above, except that the direction of arrival of the composite laser beam 53 on the array 54, defined by the angles α and β and the direction of transmission of the radiated radio beam, defined by the angles α' and β', is referenced with respect to separate reference axes. However, since the two arrays have identical geometries, the angles α' and β' always satisfy the previously established relationships, such that the following results are kept:

$$\alpha' \approx a \cdot \theta + c \cdot \alpha \text{ and } \beta' \approx b \cdot \psi + d \cdot \beta$$

where a, b, c and d have the value −1 or 1, the values of a, b, c and d depending on the interconnection structure of the photodiodes 541 with the radiating elements 551.

The radiating panel architecture described in the above text thus makes it possible to design and produce antenna radio test systems formed of two physically separate entities: a sub-assembly 51 generating a given phase law and a transmission sub-assembly 52 radiating this phase law, the phase law being transmitted from the first to the second sub-assembly, without a hardware support, via a composite laser beam.

The architecture according to the invention thus advantageously makes it possible to dispense with the mutual orientation of the two sub-assemblies 51 and 52 and, in particular, with the bias on the phase law caused by the direction of arrival of the composite laser beam, said bias being reflected in the direction of the radiated electromagnetic signal by an angular offset of a constant value equal to the angular difference between the direction of arrival of the laser beam and the reference axis of the array of photodiodes 54 receiving said laser beam. A system for correcting the phase law transmitted to the transmission sub-assembly 52 when it is generated, so as to take into account the angle of incidence of the laser beam, is therefore advantageously not necessary.

Figure 15:
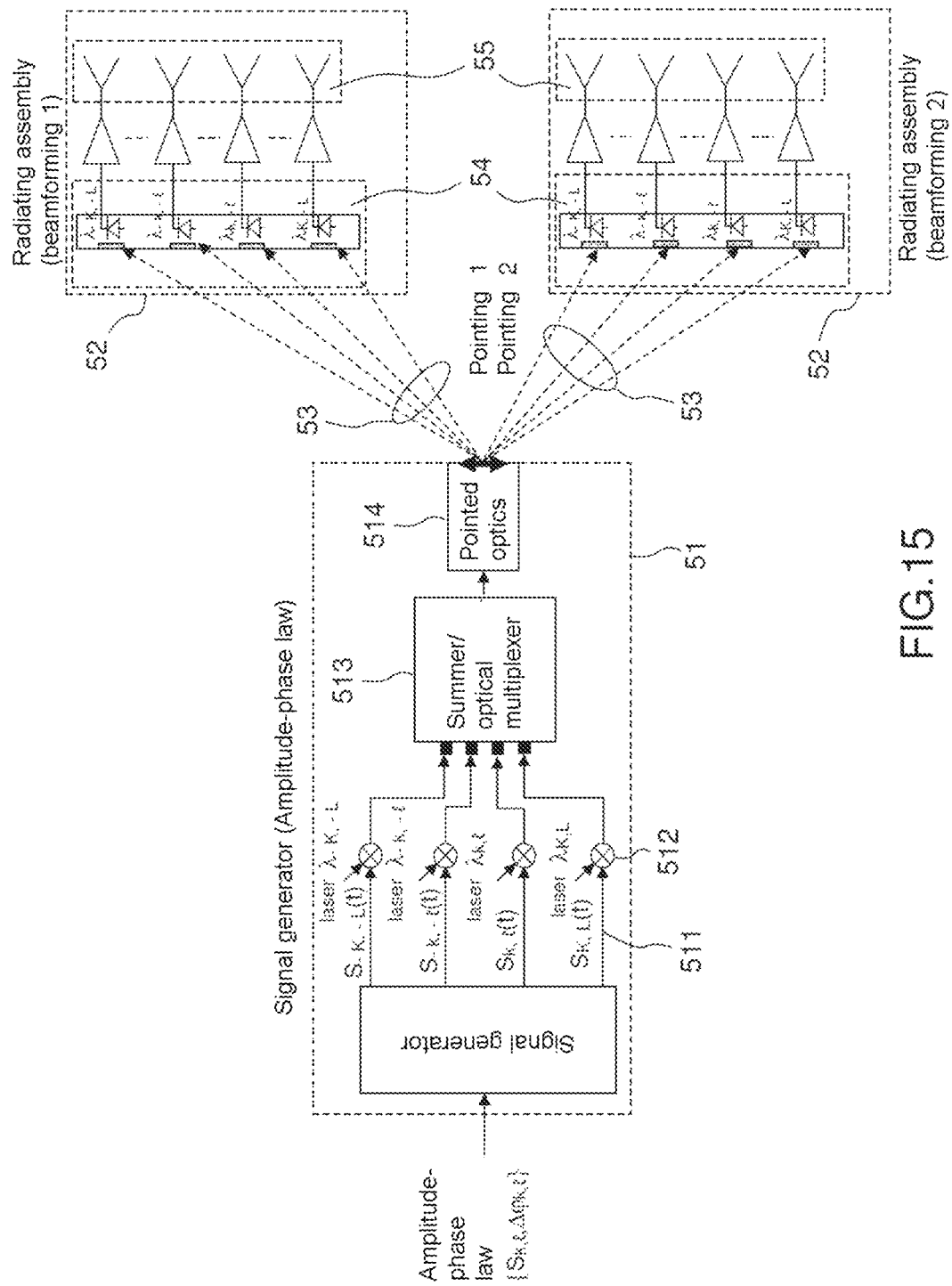
FIG. 15 shows a schematic depiction of another form of implementation of the invention in which the system comprises two transmission sub-assemblies.

FIG. 15 illustrates a variant structure of the test system according to the invention. In this variant, the system comprises a waveform generation sub-assembly 51 and a plurality of radiating sub-assemblies 52 placed at separate locations, the waveform generation system 51 then comprising pointed optics able to direct the composite laser beam 53 in various directions, each transmission sub-assembly 52 being illuminated sequentially by the laser beam 53.

The invention claimed is:

1. A device for the radio stimulation of an antenna comprising at least one transmission sub-assembly formed by an array of radiating elements each supplied with power by a signal from a photoelectric receiver integrated into an array of photoelectric receivers; as well as an electrical signal generator configured so as to synthesize, for each radiating element, an electrical excitation signal having a given amplitude and phase, as a function of the position of the radiating element in the array, in accordance with a given amplitude-phase law, said electrical signals being transmitted to the transmission sub-assembly in the form of a composite laser beam configured so as to illuminate the array of photoelectric receivers at a given incidence, said beam being obtained by multiplexing various light waves each modulated by an electrical excitation signal; the device being wherein of the photoelectric receivers is configured so as to receive a given light wave, and in that the array of photoelectric sensors and the array of radiating elements have substantially one and the same geometry with one and the same symmetry of distribution of the constituent elements in each array, each photoelectric receiver delivering its electrical signal to a radiating element occupying, within its array, a position identical to the one that said receiver occupies within its own or a position symmetrical thereto;

wherein the array of photodetectors and the array of radiating elements of the transmission sub-assembly are borne by one and the same panel formed of cells arranged in columns k and rows l, each cell comprising a photodetector and a radiating element that are substantially collocated and whose active surfaces are oriented in one and the same direction parallel to the axis (Oy); the signal generator sub-assembly being configured such that the transmitted composite laser beam illuminates the array of photodetectors in a direction defined by two angles α and β in a reference frame (Ox,Oy,Oz), such that the direction in which the radio beam is radiated is determined by two angles α' and β' defined, in the reference frame (Ox,Oy,Oz), by the relationships:

$$\alpha' \approx a \cdot \theta + c \cdot \alpha \text{ and } \beta' \approx b \cdot \psi + d \cdot \beta$$

where a, b, c and d have the value −1 or 1;

θ and ψ being the angles defining the deflection imposed on the radio beam by the phase law generated by the signal generator sub-assembly.

2. The radio stimulation device as claimed in claim 1, wherein with the panel bearing the array of photodetectors and the array of radiating elements having two axes of symmetry intersecting at a center itself forming a center of symmetry, the array of photodetectors and the array of radiating elements are electrically linked by an interconnection structure for orienting the electrical output signal of each photodetector toward a radiating element situated in a cell symmetrical to the cell in which it is located about the center of symmetry or one of the axes of symmetry.

3. The radio stimulation device as claimed in claim 2, wherein with the panel bearing the array of photodetectors and the array of radiating with the panel bearing the array of photodetectors and the array of radiating elements comprising a plurality of cells, arranged in 2K columns placed on either side of a first axis of symmetry and 2L rows, on either side of a second axis of symmetry perpendicular to the first axis of symmetry and intersecting the latter at a point O of the panel, the output of the photodetector of a cell $C_{k,l}$ delivers its electrical signal to the radiating element of the cell $C_{-k,-l}$ symmetrical to the cell $C_{k,l}$ about the center of symmetry O.

4. The radio stimulation device as claimed in claim 2, wherein with the panel bearing the array of photodetectors and the array of radiating with the panel bearing the array of photodetectors and the array of radiating elements comprising a plurality of cells, arranged in 2K columns placed on either side of a first axis of symmetry and 2L rows, on either side of a second axis of symmetry perpendicular to the first axis of symmetry and intersecting the latter at a point O of the panel, the output of the photodetector of a cell $C_{k,l}$ delivers its electrical signal to the radiating element of the cell $C_{k,-l}$ symmetrical to the cell $C_{k,l}$ about the first axis of symmetry.

5. The radio stimulation device as claimed in claim 2, wherein with the panel bearing the array of photodetectors and the array of radiating elements comprising a plurality of cells, arranged in 2K columns placed on either side of a first axis of symmetry and 2L rows, on either side of a second axis of symmetry perpendicular to the first axis of symmetry and intersecting the latter at a point O of the panel, the output of the photodetector of a cell $C_{k,l}$ delivers its electrical signal to the radiating element of the cell $C_{-k,l}$ symmetrical to the cell $C_{k,l}$ about the second axis of symmetry.

6. The radio stimulation device as claimed in claim 2, wherein with the panel bearing the array of photodetectors and the array of radiating elements comprising a plurality of cells, arranged in 2K columns placed on either side of a first axis of symmetry and 2L rows, on either side of a second axis of symmetry perpendicular to the first axis of symmetry and intersecting the latter at a point O of the panel, the output of the photodetector of a cell $C_{k,l}$ delivers its electrical signal to the radiating element belonging to the same cell $C_{k,l}$.

7. The radio stimulation device as claimed in claim 1, wherein the array of photodetectors and the array of radiating elements are borne by two separate panels formed of cells arranged in columns k and rows l, each cell of a first panel comprising a photodetector and each cell of a second panel comprising a radiating element; the signal generator sub-assembly being configured such that the transmitted composite laser beam illuminates the array of photodetectors in a direction defined by two angles α and β in a reference frame (Ox, Oy, Oz), such that the direction in which the radio beam is radiated is determined by two angles α' and β' defined, in a reference frame (Ox', Oy', Oz') homologous with the reference frame (Ox, Oy, Oz), by the relationships:

$$\alpha' \approx a \cdot \theta + c \cdot \alpha \text{ and } \beta' \approx b \cdot \psi + d \cdot \beta$$

where a, b, c and d have the value −1 or 1;

θ and ψ being the angles defining the deflection imposed on the radio beam by the phase law generated by the signal generator sub-assembly.

8. The device for the radio stimulation of an antenna as claimed in claim 1, comprising a plurality of transmission sub-assemblies and a signal generator sub-assembly, said signal generator being configured so as to produce a composite laser beam able to be directed onto the array of photodetectors of one or the other of the transmission sub-assemblies.

* * * * *

UNITED STATES PATENT AND TRADEMARK OFFICE
CERTIFICATE OF CORRECTION

| | |
|---|---|
| PATENT NO. | : 11,555,841 B2 |
| APPLICATION NO. | : 16/762125 |
| DATED | : January 17, 2023 |
| INVENTOR(S) | : Daniel Jahan et al. |

It is certified that error appears in the above-identified patent and that said Letters Patent is hereby corrected as shown below:

In the Claims

In Claim 1, Column 15, Line 33, "where a, b, c and d have the value -1 or 1;" should be -- where a, b, c and d have the value -1 or 1; and --.

Signed and Sealed this
Twenty-eighth Day of March, 2023

Katherine Kelly Vidal
*Director of the United States Patent and Trademark Office*